US 6,610,606 B2

(12) United States Patent
Sakai et al.

(10) Patent No.: US 6,610,606 B2
(45) Date of Patent: Aug. 26, 2003

(54) METHOD FOR MANUFACTURING NITRIDE COMPOUND BASED SEMICONDUCTOR DEVICE USING AN RIE TO CLEAN A GAN-BASED LAYER

(75) Inventors: Shiro Sakai, 174-4 Nakatsu-ura, Hachiman-cho, Tokushima-shi, Tokushima 770-8072 (JP); Yves Lacroix, Tokushima (JP)

(73) Assignees: Shiro Sakai, Tokushima (JP); Nitride Semiconductors Co., Ltd., Tokushima (JP)

( * ) Notice: Subject to any disclaimer, the term of this patent is extended or adjusted under 35 U.S.C. 154(b) by 0 days.

(21) Appl. No.: 10/107,549

(22) Filed: Mar. 27, 2002

(65) Prior Publication Data

US 2002/0142563 A1 Oct. 3, 2002

(30) Foreign Application Priority Data

Mar. 27, 2001 (JP) ........................................ 2001-090724

(51) Int. Cl.[7] ...................... H01L 21/302; H01L 21/461
(52) U.S. Cl. .......................................... 438/712; 438/29
(58) Field of Search ................................... 438/29, 712

(56) References Cited

U.S. PATENT DOCUMENTS

| | | | |
|---|---|---|---|
| 3,909,929 A | 10/1975 | Debesis | 29/590 |
| 4,985,113 A | * 1/1991 | Fujimoto et al. | 134/1 |
| 5,332,697 A | 7/1994 | Smith et al. | 437/242 |
| 5,786,233 A | 7/1998 | Taskar et al. | 438/46 |
| 5,888,886 A | 3/1999 | Sverdlov et al. | 438/505 |
| 5,900,650 A | 5/1999 | Nitta | 257/94 |
| 5,929,466 A | 7/1999 | Ohba et al. | 257/103 |
| 6,030,848 A | 2/2000 | Yuge et al. | 438/46 |
| 6,090,666 A | 7/2000 | Ueda et al. | 438/257 |
| 6,242,328 B1 | 6/2001 | Shin | 438/518 |

FOREIGN PATENT DOCUMENTS

| | | | |
|---|---|---|---|
| EP | 0 180 222 A2 | 5/1986 | H01L/31/18 |
| EP | 0 180 222 A3 | 5/1986 | H01L/21/308 |
| EP | 0 497 350 B2 | 8/1992 | C30B/25/02 |

(List continued on next page.)

OTHER PUBLICATIONS

Patent Abstracts of Japan, Publication No. 11111867, Publication Date Apr. 23, 1999, 1 page.
S. Sakai et al., "A New Method of Reducing Dislocation Density in GaN Layer Grown on Sapphire Substrate by MOVPE", Journal of Crystal Growth 221 (2000) pp. 334–337.
Kikuo Tominaga, et al., "Preparation of Conductive ZnO:Al Films by a Facing Target System with a Strong Magnetic Field", Thin Solid Films 253 (1994) (pp. 9–13).
Matthew Joseph, et al. "P–Type Electrical Conduction in ZnO Thin Films by Ga and N Codoping", Jpn. J. Appl. Phys. vol. 38 (1999) pp. L1205–L1207.

(List continued on next page.)

*Primary Examiner*—Wael Fahmy
*Assistant Examiner*—Howard Weiss
(74) *Attorney, Agent, or Firm*—Rosenthal & Osha L.L.P.

(57) ABSTRACT

A method for manufacturing a GaN-based semiconductor device in which an ohmic contact can be provided between the semiconductor layer and the electrode material. In a method for manufacturing wherein an n-GaN layer, an emissive layer, a p-GaN layer are formed on a substrate in that order; etching is performed to expose a portion of the n-GaN layer; and a negative electrode is formed on the n-GaN layer, the etching is performed in two sub-steps, an etching step using $BCl_3$ gas and an etching step using $Cl_2$ gas. The surface of the n-GaN layer is exposed in the first sub-step and the B (boron) contamination layer is removed in the second sub-step.

8 Claims, 6 Drawing Sheets

FOREIGN PATENT DOCUMENTS

| EP | 0 723 303 A2 | 7/1996 | ........... H01L/33/00 |
|---|---|---|---|
| EP | 0 731 490 A2 | 9/1996 | ......... H01L/21/033 |
| EP | 0 723 303 A3 | 5/1997 | ........... H01L/33/00 |
| EP | 0 779 666 A2 | 6/1997 | ........... H01L/33/00 |
| EP | 0 731 490 A3 | 3/1998 | ......... H01L/21/033 |
| EP | 0 942 459 A1 | 9/1999 | ......... H01L/21/205 |
| JP | 3-225302 | 10/1991 | |
| JP | 4-297023 | 10/1992 | ......... H01L/21/205 |
| JP | 07-263408 | * 10/1995 | |
| JP | 9-129930 | 5/1997 | |
| JP | 9-227298 | 9/1997 | ........... C30B/29/38 |
| JP | 10-22568 | 1/1998 | ............. H01S/3/18 |
| JP | 10-242576 | 9/1998 | |
| JP | 10-312971 | 11/1998 | ......... H01L/21/205 |
| JP | 11-111867 | 4/1999 | ....... H01L/21/8247 |
| JP | 11-135832 | 5/1999 | ........... H01L/33/00 |
| JP | 11-145057 | 5/1999 | ........... H01L/21/20 |
| JP | 11-145516 | 5/1999 | ........... H01L/33/00 |
| JP | 11-266004 | 9/1999 | ........... H01L/29/06 |
| JP | 11-346032 | 12/1999 | ............. H01S/3/18 |
| JP | 11-346035 | 12/1999 | ............. H01S/3/18 |
| JP | 11-354839 | 12/1999 | ........... H01L/33/00 |
| JP | 11-354840 | 12/1999 | ........... H01L/33/00 |
| JP | 11-354842 | 12/1999 | ........... H01L/33/00 |
| JP | 2000-21789 | 1/2000 | ......... H01L/21/205 |
| JP | 2000-91252 | 3/2000 | ......... H01L/21/205 |
| JP | 2000-91253 | 3/2000 | ......... H01L/21/205 |
| JP | 2000-357820 | 12/2000 | ........... H01L/33/00 |

OTHER PUBLICATIONS

Excerpt from the Workbook of the "The Tenth International Conference on Metalorganic Vapor Phase Epitaxy" Hokkaido University Jun. 5–9, 2000, 5 pages.

English/Japanese Notice of Grounds For Rejection, Japanese Patent Application Ser. No. 2000–227963, 7 pages.

English/Japanese Notice of Grounds for Rejection, Japanese Patent Application Ser. No. 2000–164349, 4 pages.

Patent Abstract of Japanese Patent No. JP10312971, published Nov. 24, 1998, 1 page.

Patent Abstract of Japanese Patent No. JP2000021789, published Jan. 21, 2000, 1 page.

Patent Abstract of Japanese Patent No. JP11354839, published Dec. 24, 1999, 1 page.

Patent Abstract of Japanese Patent No. JP11354840, published Dec. 24, 1999, 1 page.

Patent Abstracts of Japan, Publication No. 09227298A, published Sep. 2, 1997, 1 page.

Patent Abstracts of Japan, Publication No. 10022568A, published Jan. 23, 1998, 1 page.

Patent Abstracts of Japan, Publication No. 11135832A, published May 21, 1999, 1 page.

Patent Abstracts of Japan, Publication No. 11145057A, published May 28, 1999, 1 page.

Patent Abstracts of Japan, Publication No. 11145516A, published May 28, 1999, 1 page.

Patent Abstracts of Japan, Publication No. 11346032A, published Dec.14, 1999, 1 page.

Patent Abstracts of Japan, Publication No. 11346035A, published Dec. 14, 1999, 1 page.

Patent Abstracts of Japan, Publication No. 2000091252A, published Mar. 31, 2000, 1 page.

Patent Abstracts of Japan, Publication No. 2000091253A, published Mar. 31, 2000, 1 page.

Patent Abstracts of Japan, Publication No. 2000357820A, published Dec. 26, 2000, 1 page.

Patent Abstract of Japanese Patent No. JP4297023 corresponding to European Patent No. EP0497350, published Aug. 5, 1992, 1 page.

"InGaN/GaN/AlGan–based laser diodes with modulation–doped strained–layer superlattices grown on an epitaxially laterally overgrown GaN substrate", Shuji Nakamura et al. Appl. Phys. Lett. 72 (2), Jan. 12, 1988 1998 American Institute of Physics, 3 pages.

"Influence of sapphire nitridation on properties of gallium nitride grown by metalorganic chemical vapor deposition", S. Keller et al. Appl. Phys. Lett. 68 (11), Mar.11, 1996 1996 American Institute of Physics, 3 pages.

"The effect of the Si/N treatment of a nitridated sapphire surface on the growth mode of GaN in low–pressure metalorganic vapor phase epitaxy", S. Haffouz et al. Applied Physics Letters, vol. 73, No. 9, Aug. 31, 1998, 3 pages.

"Growth of high–quality GaN by low–pressure metal–organic vapour phase epitaxy (LP–MOVPE) from 3D islands and lateral overgrowth", H. Lahreche et al. N.H Elsevier Journal of Crystal Growth 205 (1999) 245–252, 8 pages.

"Optimization of Si/N Treatment Time of Sapphire Surface and Its Effect on the MOVPE GaN Overlayers", S. Haffouz et al. phys. stat. sol. (a) 176, 677 (1999), 5 pages.

"Influence of in situ sapphire surface preparation and carrier gas on the growth mode of GaN in MOVPE" P. Vennegues et al. N.H. Elsevier Journal of Crystal Growth 187 (1998) 167–177, 11 pages.

English Abstract for JP HEI 9–129930.

English Abstract for JP HEI 3–225302.

English Abstract for JP HEI 10–242576.

Patent Abstracts of Japan, Publication No. 07097300, Publication Date Apr. 11, 1995, 1 page.

Patent Abstracts of Japan, Publication No. 10178213, Publication Date Jun. 30, 1998, 1 page.

Patent Abstracts of Japan, Publication No. 10242061, Publication Date Sep. 11, 1998, 1 page.

Patent Abstracts of Japan, Publication No. 11186174, Publication Date Jul. 9, 1999, 1 page.

Patent Abstracts of Japan, Publication No. 11274557, Publication Date Oct. 8, 1999, 1 page.

Patent Abstracts of Japan, Publication No. 2000306854, Publication Date Nov. 2, 2000, 1 page.

European Search Report dated Nov. 11, 2002, 4 pages.

European Search Report dated Jan. 8, 2003, 3 pages.

* cited by examiner

METHOD FOR MANUFACTURING NITRIDE COMPOUND BASED SEMICONDUCTOR DEVICE USING AN RIE TO CLEAN A GAN-BASED LAYER

BACKGROUND OF THE INVENTION

1. Field of the Invention

The present invention relates to a nitride-based semiconductor device and a method of manufacturing the same, and, in particular, to contacts for an electrode section.

2. Description of the Related Art

In recent years, semiconductor devices which uses nitride crystals such as gallium nitride (GaN) have been developed for application in light emitting elements such as blue LEDs.

FIG. 6 is a flowchart showing a conventional manufacturing processes for a nitride-based semiconductor device. First, an n type GaN layer is formed on a sapphire substrate (step S101) and then, a GaN-based emissive layer is formed over the n type GaN layer (step S102). As the GaN-based emissive layer, for example, an InGaN layer is used. Next, a p type GaN layer is formed over the GaN-based emissive layer (step S103). The GaN layers and emissive layers can be formed by, for example, MOCVD.

Next, the emissive layer and the p type GaN layer are etched to expose a portion of the n type GaN layer (step S104). For the etching, in general, a reactive ion etching (RIE) is employed in which an RF is supplied while introducing etching gas to generate plasma for effecting the etching. As the etching gas, Cl-based gas such as $BCl_3$ or a mixture of such gases is used.

After the surface of the n type GaN layer is exposed by etching the p type GaN layer and the emissive layer, a negative electrode is formed on the exposed n type GaN layer (step S105) and a positive electrode is formed on the p type GaN layer (step S106).

As described above, in order to form a device structure such as a light emitting element on an insulative substrate such as a sapphire substrate, a positive electrode and a negative electrode must be formed, and, therefore, a portion of the GaN-based layers must be etched away. Use of a $BCl_3$-containing gas mixture has many advantages over $Cl_2$-based mixtures, such as low etching selectivity between various AlInGaN compounds. $BCl_3$-containing gas mixtures can also be used to etch other materials such as top oxides or thin metal layers, where $Cl_2$-based gas mixtures fail. The use of $BCl_3$-containing gas mixtures is therefore desired for GaN-based device fabrication.

On the other hand, when a gas mixture containing $BCl_3$ is used as the etching gas, there had been a problem in that ohmic contact cannot be easily obtained when the electrode is formed on the n type GaN layer.

FIG. 7 shows current-voltage characteristics for a an example wherein a Ti/Al electrode is formed as the negative electrode on an n type GaN layer which was etched by a gas other than a mixed gas containing $BCl_3$ and for an example wherein a Ti/Al electrode is formed as the negative electrode on an n type GaN layer which was not etched. In FIG. 7, the horizontal axis represents the applied voltage (V) and the vertical axis represents current (mA). For an electrode to be said "ohmic", the current-voltage characteristic must be such that the current linearly changes with the change in the applied voltage. In contrast, in the case where the etching was performed using a gas mixture containing $BCl_3$, current did not flow until a voltage of 7 V or greater is applied, that is, the contact is not ohmic and, thus, the light emitting efficiency is decreased.

SUMMARY OF THE INVENTION

The present invention was conceived to solve the above problem and one object of the present invention is to realize an ohmic contact between a GaN-based layer and an electrode.

In order to achieve at least the object mentioned above, according to the present invention, there is provided a method for manufacturing a nitride-based compound semiconductor, comprising the steps of (a) forming a p type GaN-based layer and an n type GaN-based layer on a substrate; (b) etching to expose a portion of the GaN-based layer which is not exposed on the front surface among the GaN-based layers; and (c) forming an electrode on the surface of the exposed GaN-based layer. Here, the etching step (b) includes the sub-steps of (b1) exposing a portion of the GaN-based layer through reactive ion etching using gas containing boron, and (b2) removing boron contamination layer on the surface of the GaN-based layer through reactive ion etching using gas which does not contain boron.

When an n type GaN-based layer is formed on the substrate and then a p type GaN-based layer is formed thereon, the n type GaN-based layer is the GaN-based layer which is not exposed at the surface. In such a case, during the etching step, part the layer formed above the n type GaN-based layer is removed to expose the n type GaN-based layer. Use of a $BCl_3$-containing gas mixture has many advantages over $Cl_2$-based mixtures, such as low etching selectivity between various AlInGaN compounds. $BCl_3$-containing gas mixtures can also be used to etch other materials such as top oxides or thin metal layers, where $Cl_2$-based gas mixtures fail. The use $BCl_3$-containing gas mixtures is therefore desired for GaN-based device fabrication. On the other hand, when $BCl_3$ gas is used in the etching step, there is a problem in that the surface of the GaN-based layer is contaminated by boron and ohmic contact cannot be obtained. To this end, in the present invention, the etching step is performed through two separate stages or sub-steps. In the first sub-step, etching is performed using a gas which includes boron (B) such as, for example, $BCl_3$, to expose a portion of the surface of the GaN-based layer while preventing the hardening of the photoresist. In the second sub-step, etching is performed using a gas which does not include boron, such as, for example, $Cl_2$, to remove the B contamination layer on the exposed surface of the GaN-based layer. In this manner, by executing the etching step in two sub-steps, an ohmic contact can be realized without the layer containing B present at the boundary between the GaN-based layer and the electrode.

In one embodiment of the present invention, an n type GaN-based layer, a GaN-based emissive layer, and a p type GaN-based layer are sequentially formed on a substrate, and then the GaN-based emissive layer and the p type GaN-based layer are etched through reactive ion etching to expose a portion of the surface of the n type GaN-based layer. Here, the reactive ion etching step comprises a first sub-step in which $BCl_3$ gas is used and a second sub-step in which $Cl_2$ gas is used. Next, a negative electrode is formed on the surface of the n type GaN-based layer and a positive electrode is formed on the surface of the p type GaN-based layer, to thereby obtain a light emitting element.

FIG. 3 shows a SIMS (secondary ion mass spectrometer) results for a sample in which the GaN-based layers were etched by reactive ion etching using $BCl_3$ gas and then a Ti/Al contact layer was formed. In FIG. 3, the horizontal axis represents time (in seconds) which corresponds to the depth from the surface (Ti/Al surface). It can be seen from FIG. 3 that B is present at the boundary between the Ti/Al which is the electrode material and the GaN-based layer of the semiconductor layer. In other words, when the GaN-based layer is etched using $BCl_3$, its surface is contaminated by B and this contamination layer blocks electrical conduction between the GaN-based layer and the electrode material.

FIG. 4 shows a SIMS result of a sample in which the GaN-based layer was etched through reactive ion etching using $BCl_3$ gas and then etched through reactive ion etching using $Cl_2$, and a Ti/Al contact layer was formed. Upon comparison with FIG. 3, it can be seen that substantially no B is present (B is present only in a negligible amount) at the boundary between the Ti/Al, which is the electrode material, and the GaN-based layer of the semiconductor layer.

According to the present invention, because the GaN-based layer is exposed by the first etching sub-step and the B contamination layer on the surface of the GaN-based layer is removed by the second etching sub-step, the RF power to be applied in the second etching sub-step can be at a level necessary and sufficient for removing only the B contamination layer. Thus, it is possible to use weaker RF power in the second sub-step than in the first sub-step (i.e. RF power of first sub-step>RF power of second sub-step). In the second etching sub-step, it is preferable to set the RF power to a degree such that the photoresist which is used for exposing the GaN-based layer is not damaged. Also, because the etching need not be performed beyond the B contamination layer, the depth of the etching is preferably 10 nm or greater, and more preferably 20 nm or greater and 100 nm or less. For example, an etching depth of approximately 50 nm is desirable.

DESCRIPTION OF PREFERRED EMBODIMENT

Figure 1:
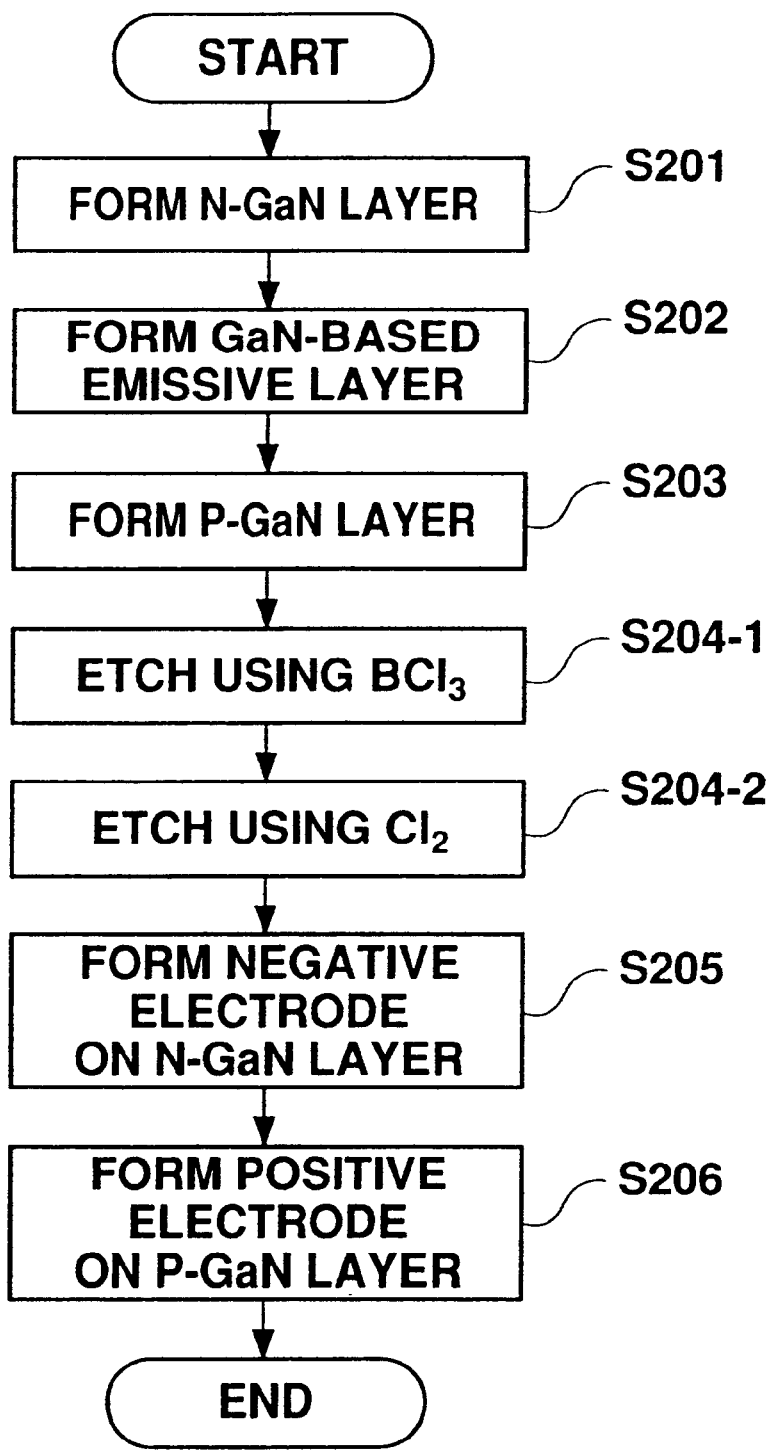
FIG. 1. is a flowchart showing a method of manufacturing according to the present invention.

A preferred embodiment of the present invention will now be described using light emitting elements as example and referring to the drawings.

Figure 2A:
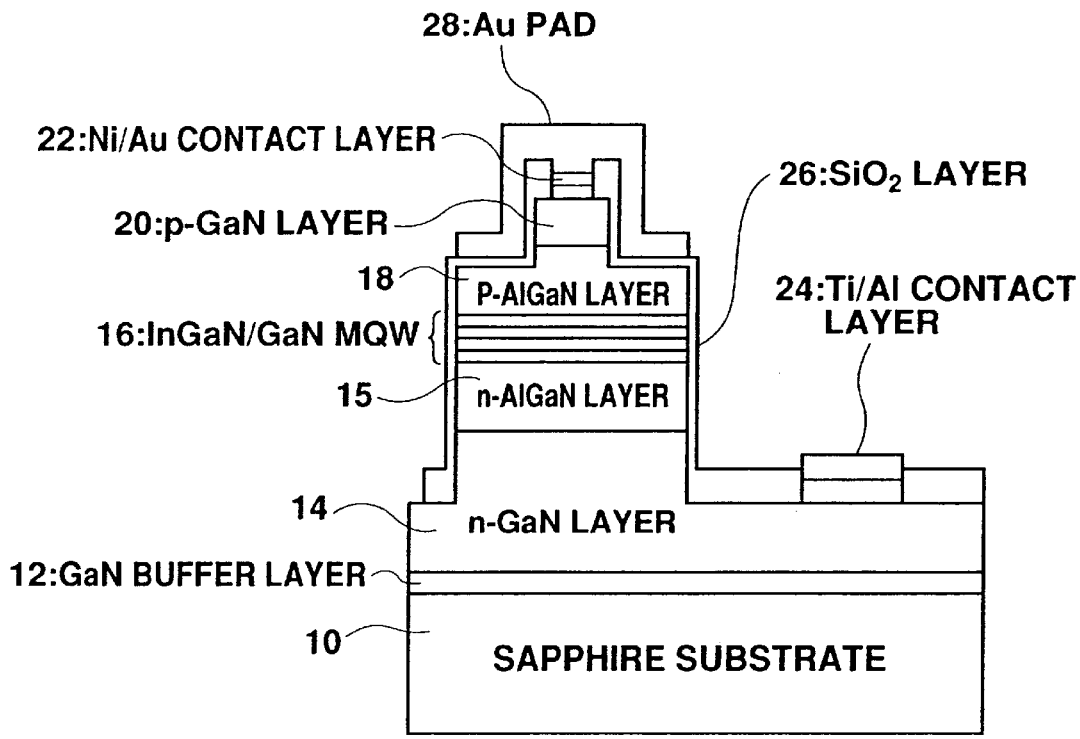
FIGS. 2A and 2B are diagrams for explaining structures of light emitting elements according to the present invention.
Figure 2B:
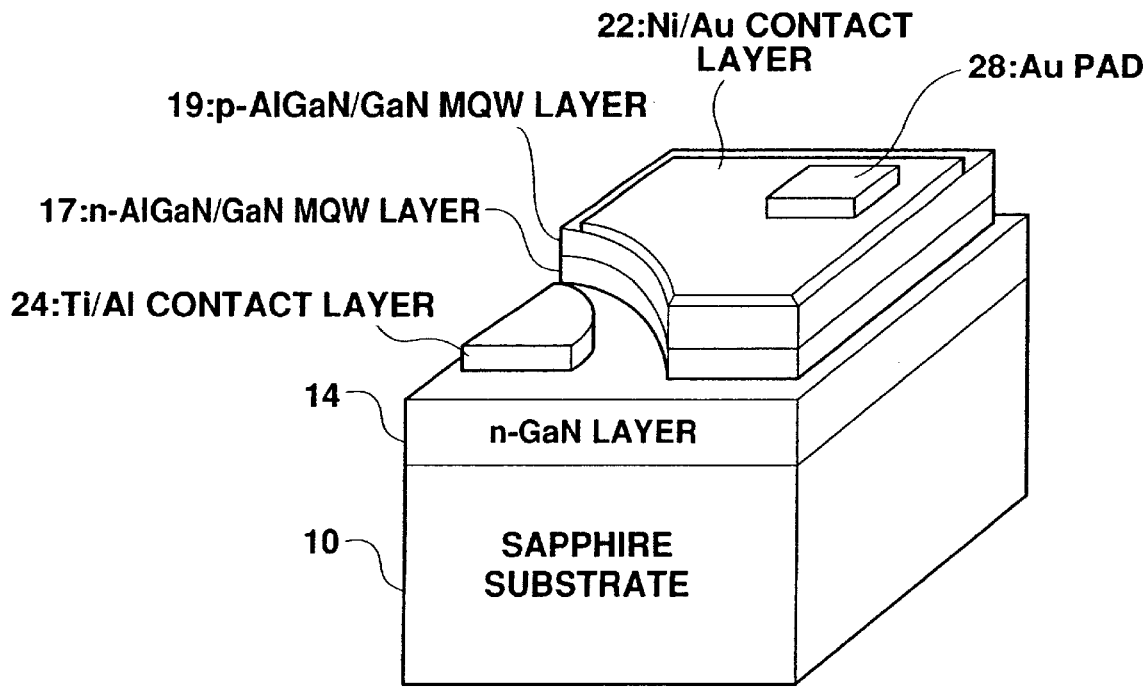
Figure 3:
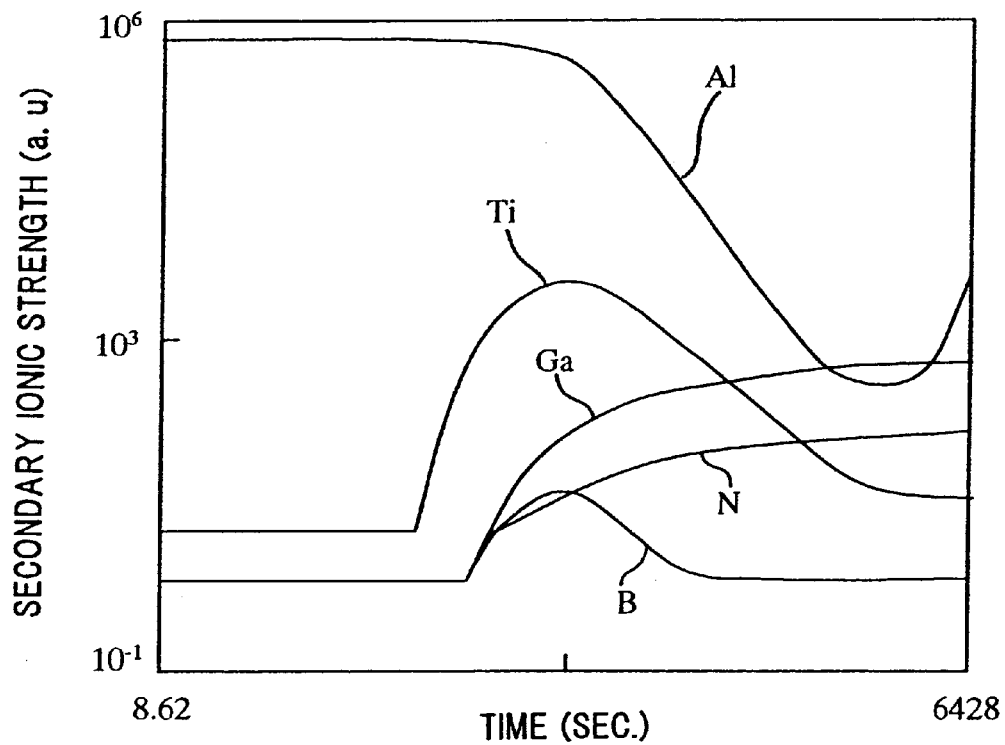
FIG. 3 is a graph showing SIMS (secondary ion mass spectrometer) results after RIE using BCl3 gas.
Figure 4:
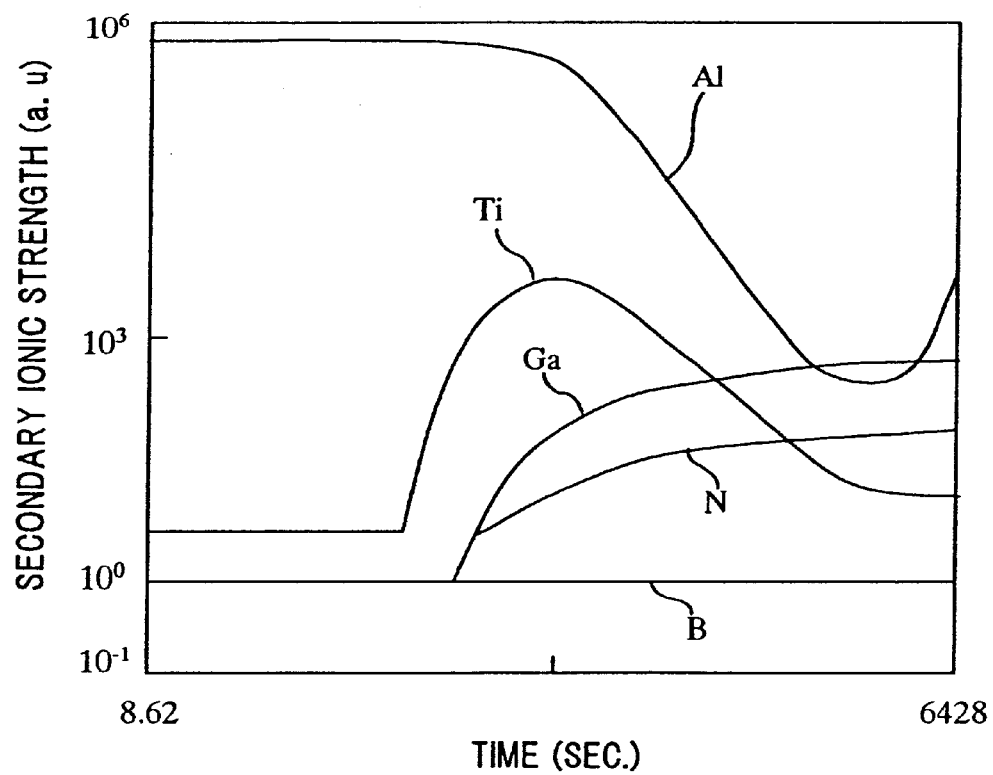
FIG. 4 is a graph showing the SIMS results after RIE with two-stage etching.
Figure 6:
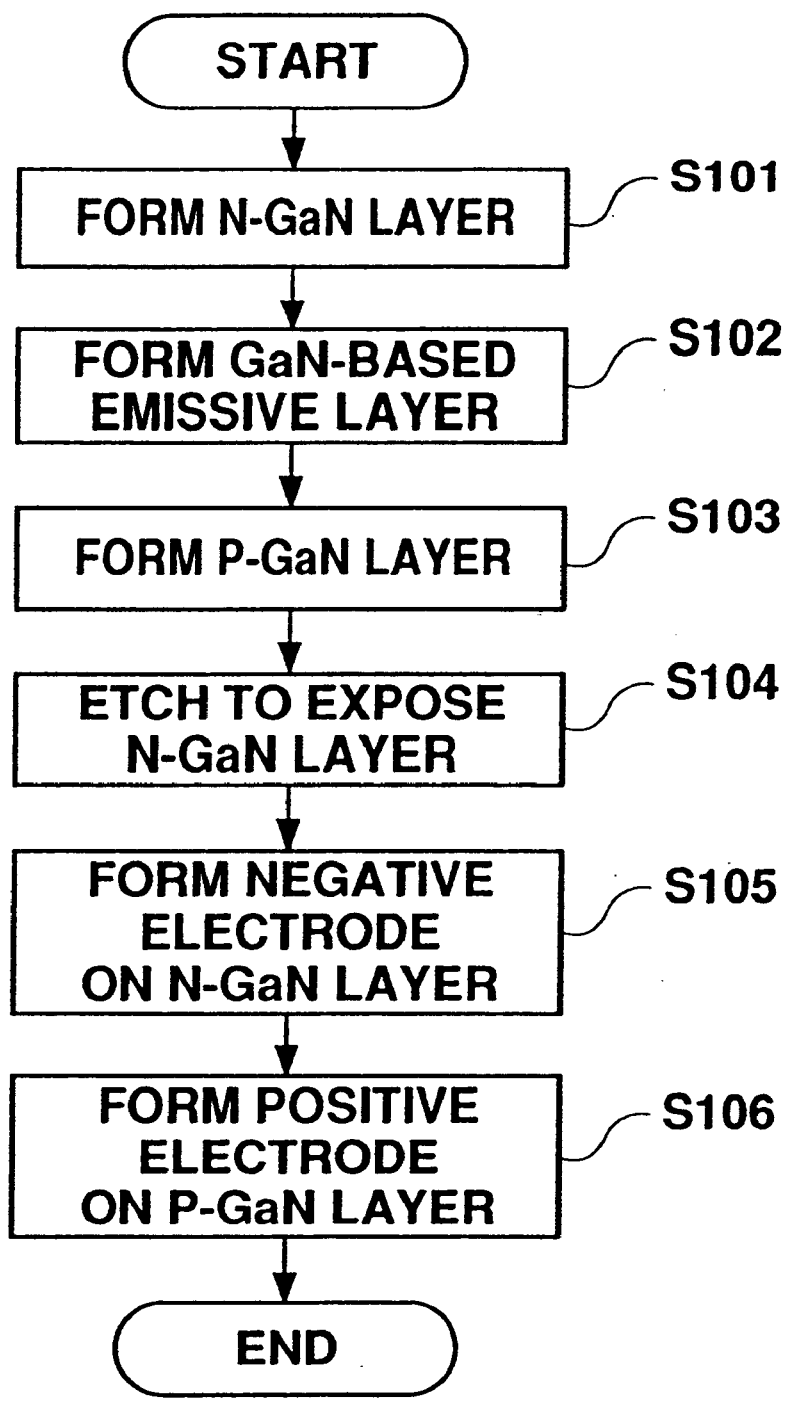
FIG. 6 is a flowchart showing a conventional method of manufacturing.
Figure 7:
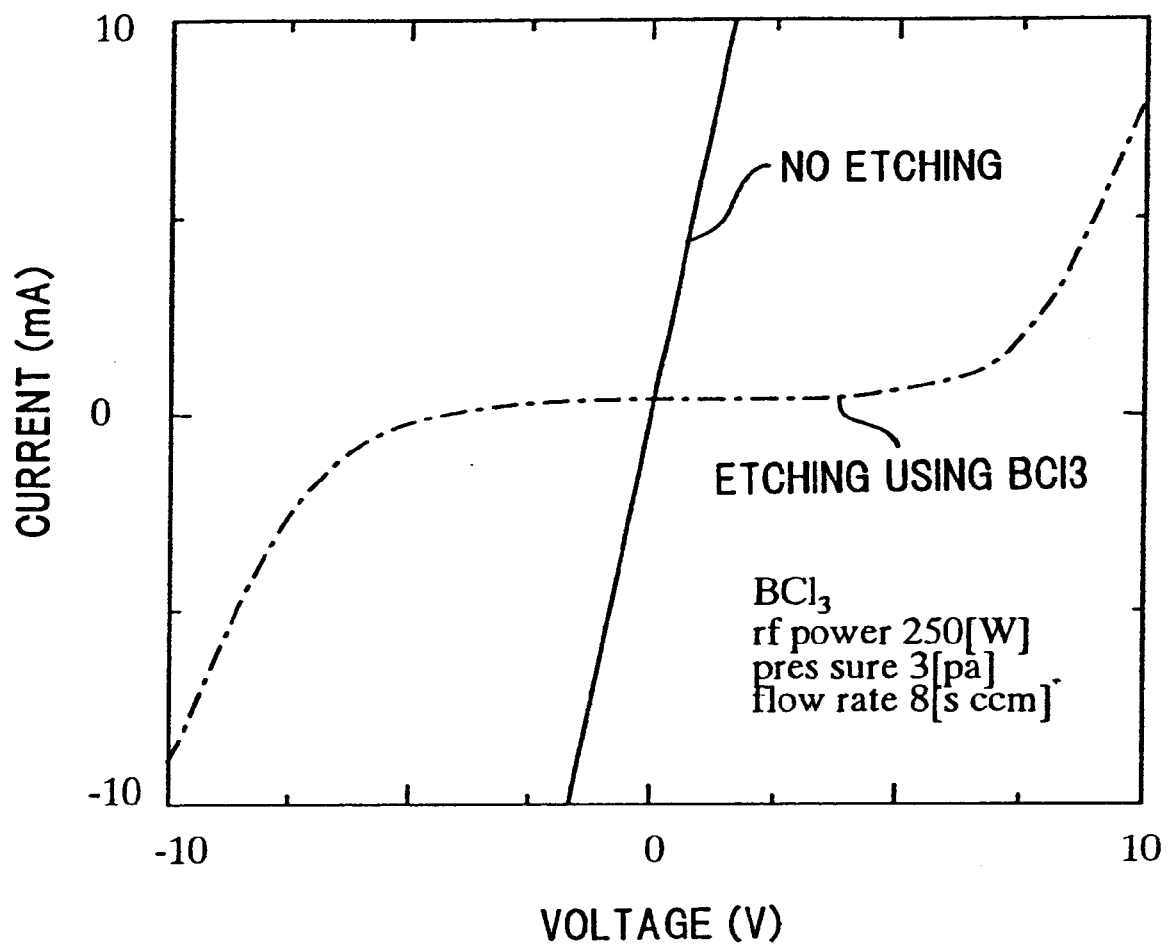
FIG. 7 is a voltage-current characteristic graph of a light emitting element manufactured by a conventional art.

FIG. 1 is a flowchart of a method for manufacturing a light emitting element according to the embodiment. FIGS. 2A and 2B show light emitting elements that are manufactured by the method for manufacturing according to the embodiment. In FIG. 1, the processes in steps S201 through S203 are identical to steps S101 through S103 in FIG. 6. Namely, in step S201, an-GaN layer is formed on a sapphire substrate, in step S202, a GaN-based emissive layer is formed, and in step S203, a p-GaN layer is formed over the GaN-based emissive layer. These layers can be grown by MOCVD. In a light emitting element of the type shown in FIG. 2A, a GaN buffer layer 12 is first formed on a sapphire substrate, and then a n-GaN layer 14 and an n-AlGaN layer 15 are formed. As a GaN-based emissive layer, an MQW (multiple quantum well) layer 16 of InGaN/GaN is formed, and as a p-GaN layer, a p-AlGaN layer 18 and a p-GaN layer 20 are formed. On the other hand, in a light emitting element of the type shown in FIG. 2B, an n-GaN layer 14 is formed as a n-GaN layer on a sapphire substrate 10, and a layer 17 of n-AlGaN/GaN and an layer 19 of p-AlGaN/GaN are formed.

After the p-GaN layer is formed, etching is performed to expose a portion of the n-GaN layer. In the present embodiment, the etching step comprises two stages or sub-steps. Namely, the first sub-step (S204-1) is an RIE using $BCl_3$ gas and the second sub-step (S204-2) is an RIE using a gas which does not contain $BCl_3$, more specifically, using $Cl_2$ gas. As described above, when the etching is performed using a gas containing boron (B), B remains on the surface of the n-GaN layer, and, because of this B contamination layer, the electrical conduction between the n-GaN layer and the electrode material is blocked.

By etching through the first sub-step of RIE using $BCl_3$ gas to expose a portion of the n-GaN layer and then etching using $Cl_2$ under conditions that do not adversely affect the photoresist, the B contamination layer on the surface of the n-GaN layer can be removed. Specific conditions for etching may be, for example, RF 250 W and 3 Pa for the etching of the first sub-step using $BCl_3$ gas and RF 25 W and 1.5 Pa for the etching of the second sub-step using $Cl_2$ gas for approximately 50 nm.

After a portion of the n-GaN layer is exposed through the two stage etching, a negative electrode is formed on the exposed n-GaN layer (step S205) and a positive electrode is formed on the p-GaN layer (step S206). In the light emitting element shown in FIG. 2A, a Ni/Au contact layer 22 and a Au pad 28 are formed on the p-GaN layer as the positive electrode and a Ti/Al contact layer 24 is formed on the n-GaN layer 14 as the negative electrode. Also, after the contact layers are formed, $SiO_2$ layer 26 is formed to electrically isolate the surface. In the light emitting element of FIG. 2B, a Ni/Au contact layer 22 and Au pad 28 are formed on the p-AlGaN/GaN MQW layer 19 as the positive electrode and a Ti/Al contact layer 24 is formed on the n-GaN layer 14 as the negative electrode. In both FIGS. 2A and 2B, because etching using $BCl_3$ gas and etching using $Cl_2$ gas are combined in order to expose a portion of the n-GaN layer 14, the B contamination layer at the boundary between the n-GaN layer 14 and the Ti/Al contact layer 24 is removed, and, thus, B is either not present at all or is only present in a concentration reduced to a level so small that it can be safely ignored.

Figure 5:
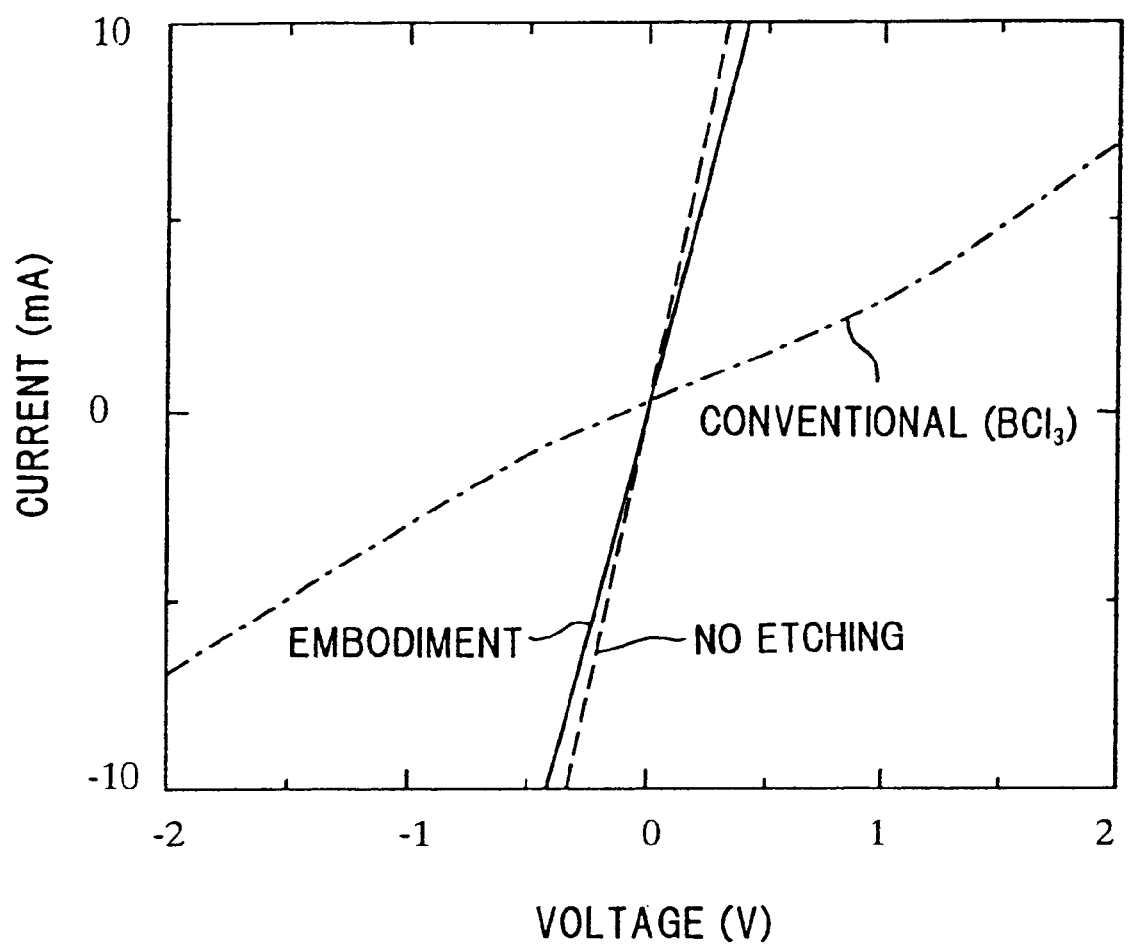
FIG. 5 is a voltage-current characteristic graph of a light emitting element manufactured by the method of the present invention.

FIG. 5 shows current-voltage characteristics of a light emitting element manufactured by the method of the present embodiment. FIG. 5 also shows current-voltage characteristics of a light emitting element in which a Ti/Al contact layer is formed on the n-GaN layer without etching using $BCl_3$ (labeled "no etching") and of a light emitting element in which a Ti/Al contact layer is formed on the n-GaN layer after performing only the etching using $BCl_3$ (labeled "conventional")). The horizontal axis of FIG. 5 represents voltage (V) and the vertical axis represents current (mA). From the graph, it can be seen that with the two stage etching of the embodiment, a linear relationship between the voltage and current can be obtained similar to when etching is not performed.

For the two stage etching according to the present invention, the RF power and the duration for each of the etching sub-steps must be chosen so that a high RF power is employed in the first etching sub-step using $BCl_3$ gas to increase the production efficiency through high etching rate and so that the photoresist is not adversely affected during the second etching sub-step using $Cl_2$ gas because the object of the second etching sub-step is to remove the contamination layer. The present inventors have found after various experiments that the required etching depth of the second sub-step is 10 nm or greater, and that the etching depth is more preferably 20 nm or greater and even more preferably 50 nm or greater. An optimal etching depth can be set at, for example, 50 nm.

In the embodiment, an example wherein an n-GaN layer, an emissive layer, and a p-GaN layer are formed on a substrate in that order has been described. The present invention, however, can also be applied to a case where a p-GaN layer, an emissive layer, and an n-GaN layer are formed on the substrate in that order. In such a case, the p-GaN layer is exposed by RIE and a positive electrode is formed on the p-GaN layer. Similar to the example described, the RIE is performed in two stages. That is, in a structure of substrate/first conductive type GaN layer/emissive layer/second conductive type GaN layer, the combination of the first and second conductive type, (first conductive type, second conductive type), may be either (p, n) or (n, p).

Furthermore, although in the example used to illustrate the embodiment, the first sub-step is performed using $BCl_3$ and the second sub-step is performed using $Cl_2$, these gases are only exemplary and other gases can be used, for example, a gas that hardens the photoresist (gas that does not contain $Cl_2$) can be employed in the first sub-step and gas that can remove the contamination layer on the surface of the GaN-based layer can be used in the second sub-step.

As described, according to the present invention, an ohmic contact between the semiconductor layer and the electrode material can be realized and the element characteristics can be improved.

What is claimed is:

1. A method for manufacturing a nitride-based compound semiconductor, comprising the steps of:
    (a) forming a p type GaN-based layer and an n type GaN-based layer on a substrate;
    (b) performing etching to expose a portion of the GaN-based layer which is interposed between said substrate and another GaN-based layer; and
    (c) forming an electrode on a surface of the exposed GaN-based layer, wherein said etching step (b) includes the steps of:
        (b1) exposing a portion of said GaN-based layer through reactive ion etching using a gas containing boron; and
        (b2) removing boron contamination from the surface of said GaN-based layer through reactive ion etching using a gas which does not contain boron.

2. A manufacturing method according to claim 1, wherein:
    said gas containing boron in said sub-step (b1) is a gas containing $BCl_3$; and
    said gas which does not contain boron in said sub-step (b2) is a gas containing $Cl_2$.

3. A manufacturing method according to claim 1, wherein the RF power of said reactive ion etching in said sub-step (b1) is greater than the RF power of said reactive ion etching in said sub-step (b2).

4. A manufacturing method according to claim 1, wherein the etching depth at said sub-step (b2) is 10 nm or greater.

5. A manufacturing method according to claim 1, wherein the etching depth at said sub-step (b2) is 20 nm or greater.

6. A manufacturing method according to claim 1, wherein the etching depth at said sub-step (b2) is approximately 50 nm.

7. A method for manufacturing a nitride-based compound semiconductor, comprising the steps of:
    (a) forming a first conductive type GaN-based layer on a substrate;
    (b) forming a GaN-based emissive layer on said first conductive type GaN-based layer;
    (c) forming a second conductive type GaN-based layer on said GaN-based emissive layer;
    (d) removing, through reactive ion etching, a portion of said second conductive type GaN-based layer and said GaN-based emissive layer so that a portion of said first conductive type GaN-based layer is exposed; and
    (e) forming a first conductive type electrode on the surface of said exposed first conductive type GaN-based layer and forming a second conductive type electrode on the surface of said second conductive type GaN-based layer; wherein
    said step (d) comprises the sub-steps of:
        (d1) executing reactive ion etching to expose a portion of the surface of said first conductive type GaN-based layer; and
        (d2) executing reactive ion etching using a gas different from the gas used in said sub-step (d1) to remove a contamination layer formed by the gas in said sub-step (d1) on the surface of said first conductive type GaN-based layer.

8. A manufacturing method according to claim 7, wherein
in said sub-step (d1), said reactive ion etching is executed using $BCl_3$ gas to expose a portion of said first conductive type GaN layer; and
in said sub-step (d2), said reactive ion etching is executed using $Cl_2$ gas to remove a boron contamination layer formed on the surface of said first conductive type GaN-based layer.

* * * * *